United States Patent
Sheen

(10) Patent No.: US 6,677,833 B2
(45) Date of Patent: Jan. 13, 2004

(54) MULTILAYERED BAND SEPARATOR WITH GROUNDING PARASITIC CAPACITOR

(75) Inventor: Jyh-Wen Sheen, Ilan Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 38 days.

(21) Appl. No.: 10/123,234

(22) Filed: Apr. 17, 2002

(65) Prior Publication Data
US 2003/0058063 A1 Mar. 27, 2003

(30) Foreign Application Priority Data
Sep. 21, 2001 (TW) .......................... 90123296 A

(51) Int. Cl.$^7$ .............................. H03H 7/46; H03H 7/48
(52) U.S. Cl. .................. 333/132; 333/129; 333/176
(58) Field of Search ........................ 333/132, 126, 333/128, 129, 134, 176, 185

(56) References Cited

U.S. PATENT DOCUMENTS 5,258,728 A * 11/1993 Taniyoshi et al. ............ 333/132
5,880,649 A * 3/1999 Tai et al. ..................... 333/132
6,097,268 A * 8/2000 Watanabe et al. ............ 333/132
6,243,564 B1 * 6/2001 Yorita ........................... 455/83

* cited by examiner

Primary Examiner—Terry D. Cunningham
Assistant Examiner—Quan Tra
(74) Attorney, Agent, or Firm—Birch, Stewart, Kolasch & Birch, LLP

(57) ABSTRACT

A multilayer band separator with a grounding parasitic capacitor. The separator includes a quasi-highpass filter, a semi-lumped lowpass filter and a phase shifter. The quasi-highpass filter includes a third capacitor connected to an input signal, a fourth capacitor with one end connected to the third capacitor and the other end connected to ground, an inductive element with one end connected to ground and the other end connected to the connection point of the third and fourth capacitors, and a second capacitor with one end connected to the connection point of the third capacitor, the fourth capacitor and the inductive element and the other end connected to a second output to pass a high-frequency output signal. The phase shifter is a transmission line element connected to the input signal. The semi-lumped lowpass filter includes an inductive element with one end connected to the end of the phase shifter without the input signal and the other end connected to a first output to pass a low-frequency output signal, and a first capacitor connected in parallel to the inductive element.

6 Claims, 6 Drawing Sheets

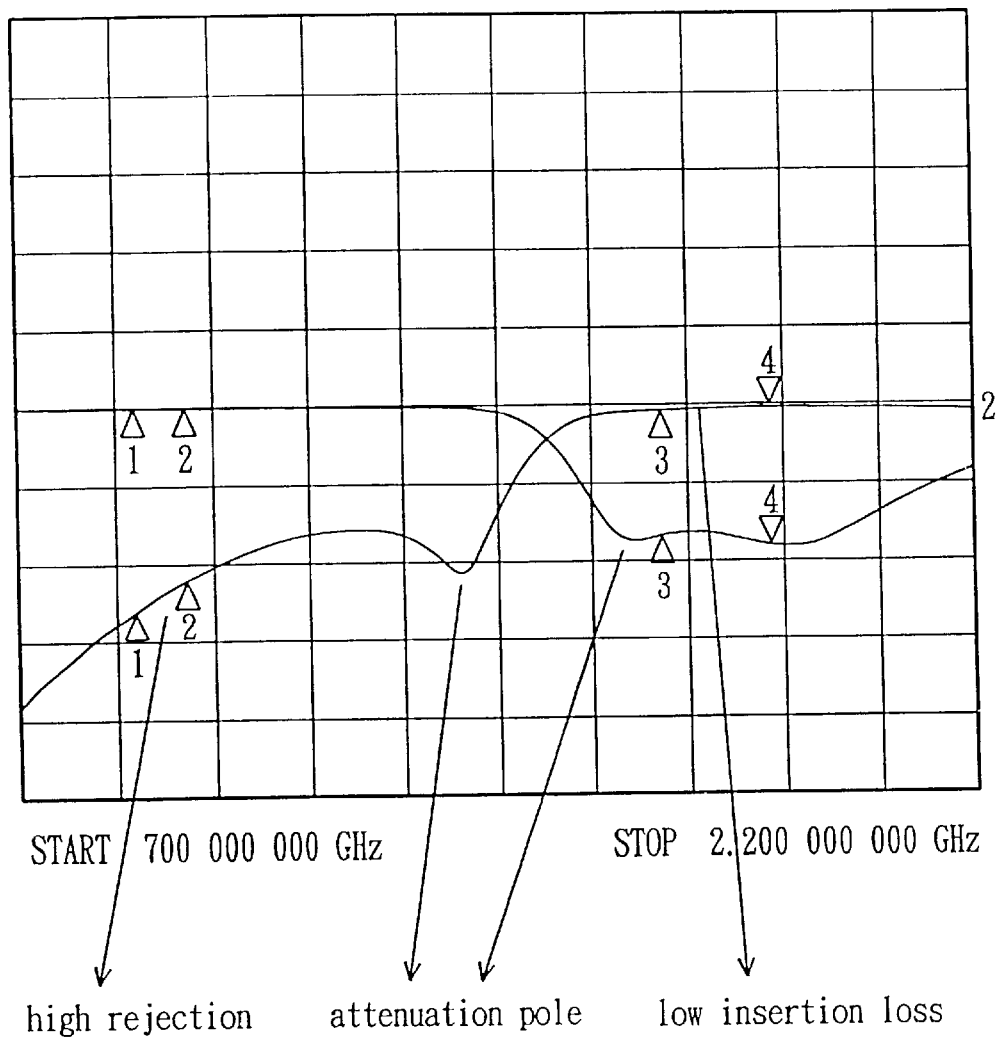
Appendix A

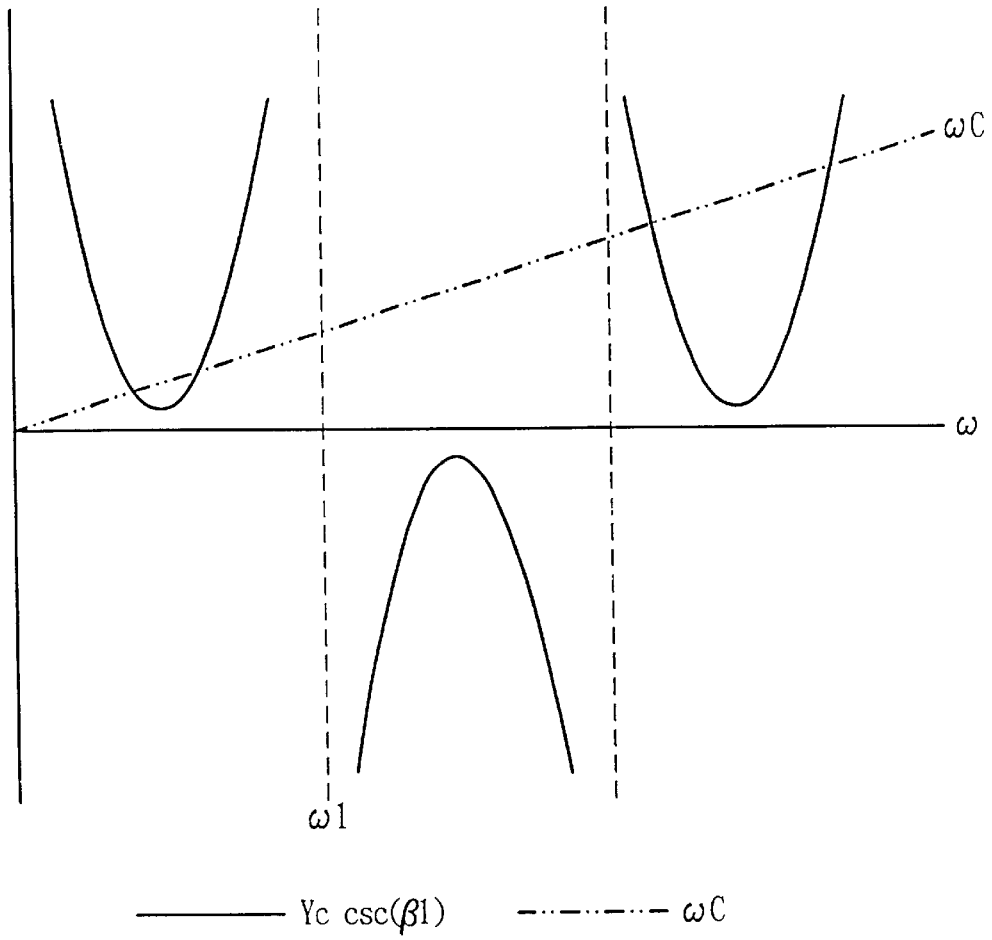
Appendix B

US 6,677,833 B2

MULTILAYERED BAND SEPARATOR WITH GROUNDING PARASITIC CAPACITOR

BACKGROUND OF THE INVENTION

1. Field of the Invention

The invention relates to a filtering device used in wireless communication, especially to a multilayered band separator, which uses transmission lines as inductors and ground parasitic capacitors to shorten the required grounding transmission line length, thereby reaching a reduction size goal.

2. Description of Related Art

In wireless communication, multiband operation is widely employed. In a current wireless communication system design, a dual-frequency filter (duplexer) or a band separator in design generally considers the following factors: insertion loss, guard band, isolation, and outband rejection. When a separate band is very wide and has a strict demand on insertion loss and isolation, a lowpass-and-highpass filter is preferable. When the separate band is very wide and has a strict demand on insertion loss only, the combination of two bandstop filters is preferable. When size and outband rejection are important, the combination of two bandpass filters or a bandpass-and-bandstop filter is preferable. When the separate band is very narrow and has a strict demand on insertion loss, a bandstop-and-highpass filter is preferable. For example, for the GSM900/DCS1800 dual-band filter applied in Taiwan or the AMPS900/PCS1900 dual-band filter applied in USA, the separate band is wide and demands less insertion loss, so that a lowpass-and-highpass filter or the combination of two bandstop filters is preferable.

FIG. 1 is a typical multilayered band separator with the combination of two bandstop filters for a GSM/DCS dual-band handset. Two bandstop filters, Notch 1, Notch 2, respectively include a shunt capacitor and inductor. As shown in FIG. 1, when inputting signal at T1, the filter separately outputs the signal within 900 MHz-band at T3 and the signal within 1800 MHz-band or 1900 MHz-band at T2 due to the different LC response parameters. The output signals are shown in FIG. 2. Because the GSM/DCS dual-band handset meeting isolation bandwidth requirement at 20 dB is 10% or more of the entire bandwidth, the circuit mentioned above cannot meet isolation bandwidth requirement. Accordingly, referring to FIG. 3, an improved circuit is shown in U.S. Pat. No. 5,880,649 by Tai et al. In FIG. 3, besides two bandstop filters, a lowpass filter formed by a capacitor and a highpass filter formed by a shunt LC are included. As shown in FIG. 3, when signal T11 respectively passes through two bandstop filter Notch 3, Notch 4 and the corresponding lowpass and highpass filters, the output signal is separated respectively at f=900 MHz-band for T33 and at f2=1800 or 1900 MHz-band for T22. As shown in FIG. 4, the dual output signal response diagram illustrates such a circuit layout capable of enlarging the bandwidth at 20 dB to meet the system requirement by adding a stage filter. However, this makes the circuit more complicated and costs more.

SUMMARY OF THE INVENTION

Accordingly, an object of the invention is to provide a multilayered band separator with grounding parasitic capacitor, which uses a grounding transmission line as an inductor and a grounding parasitic capacitor to shorten the required grounding transmission line for the purpose of miniaturization and thereby having less insertion loss.

Another object of the invention is to provide a multilayered band separator with transmission line section, which converts an attenuation pole of a lowpass filter into an open-circuit pole and produces an attenuation pole on the low-frequency portion of a high-frequency port by a series lowpass filter, so that a better rejection effect is gained without an additional filter stage.

The invention provides a multilayered band separator with grounding parasitic capacitor, which uses a parasitic capacitor and a transmission line so as to have less insertion loss and better rejection. The multilayered band separator with grounding parasitic capacitor includes: a quasi-highpass filter, a semi-lumped lowpass filter and a phase shifter. The quasi-highpass filter includes a third capacitor connected to antenna port/input port, a fourth capacitor with an end connected to the first capacitor and another end connected to grounding, an inductive device with an end connected to grounding and another end connected to the connection point of the third and fourth capacitors, and a second capacitor with an end connected to a higher-band output end and another end connected to the connection point of the third and fourth capacitors and the inductive device to pass a high-frequency output signal. The phase shifter is a transmission line connected to the antenna port/input port. The semi-lumped lowpass filter includes an inductive device with an end connected to a lower-band output end and another end connected to another end of the phase shifter to produce a low-frequency output signal, and a first capacitor connected across the inductive device.

As noted above, the inductive devices are implemented in the form of transmission line, thus the invention presents the characteristics of the quasi-highpass filter, thereby having less insertion loss. The phase shifter is also implemented in the form of a transmission line, thus the invention can convert the attenuation pole of the semi-lumped lowpass filter into open-circuit pole and further produce an attenuation pole on the low-frequency side of quasi-highpass filter by applying the phase shifter connected in series with the lowpass filter, so that better rejection effect and additional isolation bandwidth are gained without an additional filter stage.

BRIEF DESCRIPTION OF THE DRAWINGS

The invention will become apparent by referring to the following detailed description of a preferred embodiment with reference to the accompanying drawings, wherein.

Figure 1:
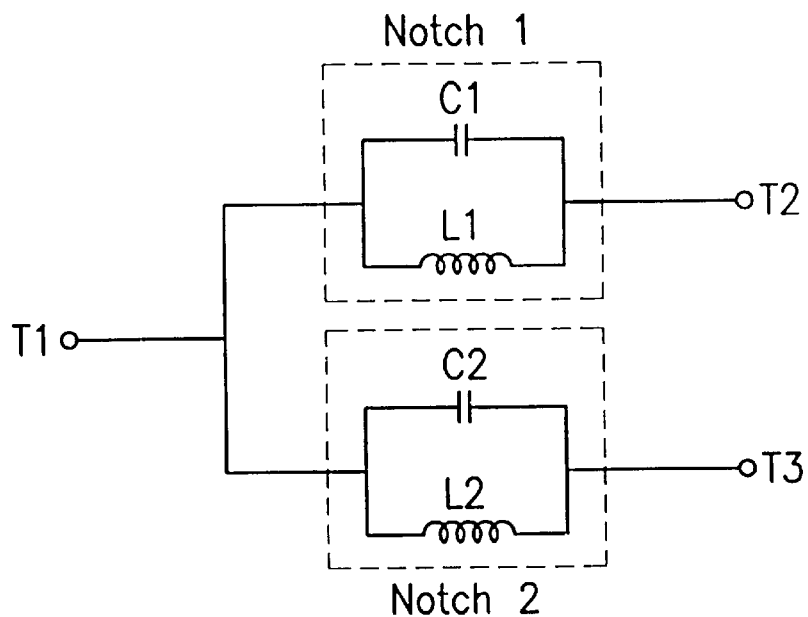
FIG. 1 is a schematic diagram of a typical multilayered band separator.
Figure 2:
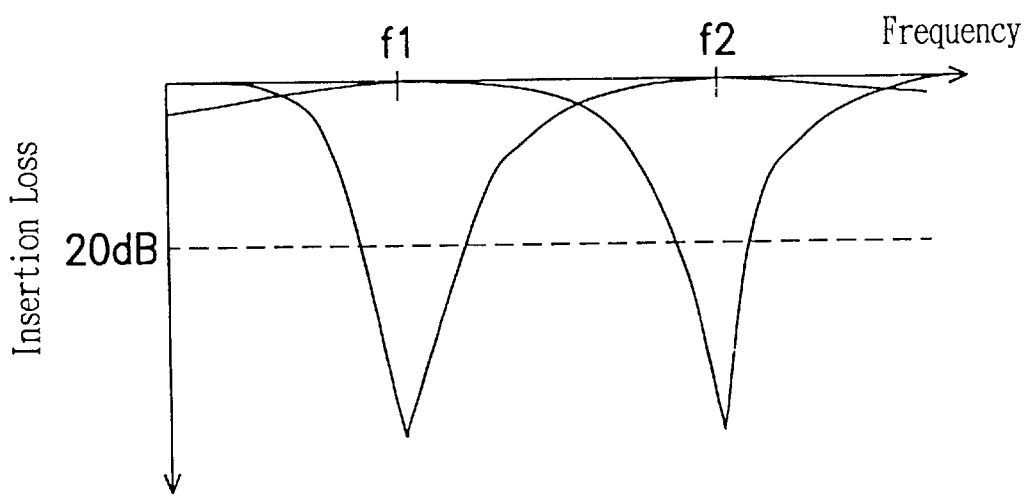
FIG. 2 is a diagram of the circuit response characteristics of FIG. 1.
Figure 3:
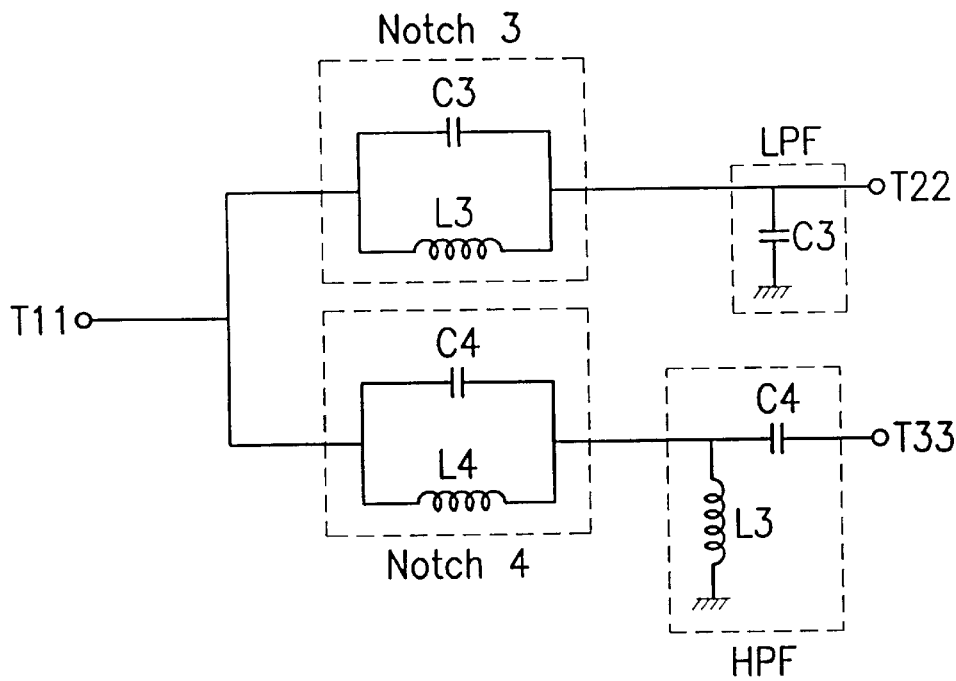
FIG. 3 is a schematic diagram of another typical multilayered band separator.
Figure 4:
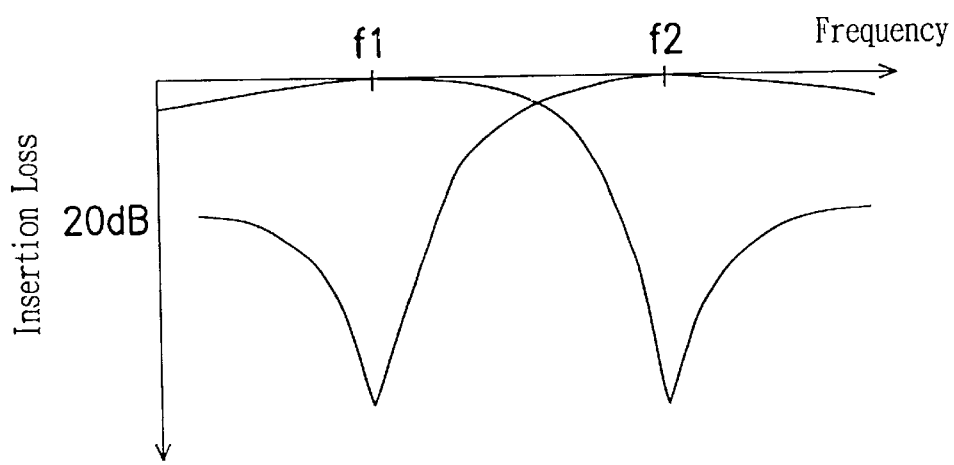
FIG. 4 is a diagram of the circuit response characteristics of FIG. 3.
Figure 5:
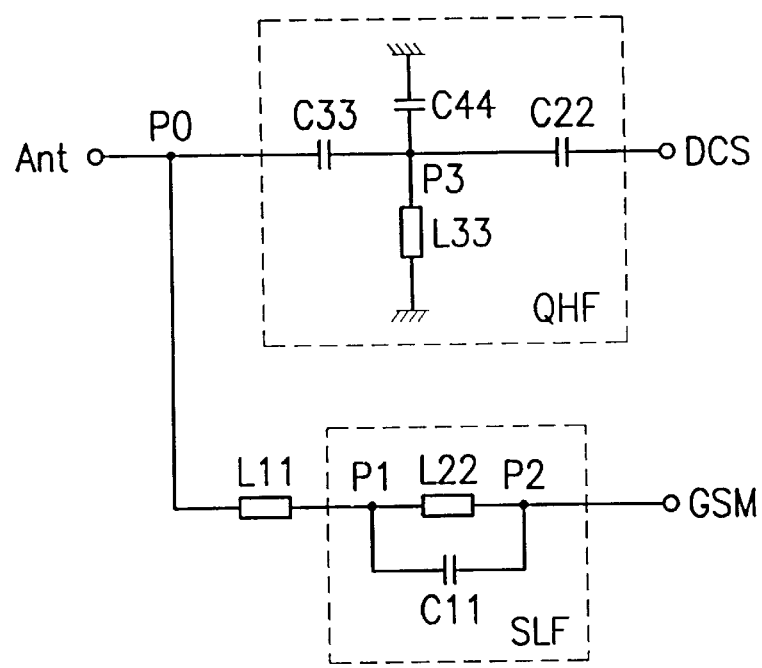
FIG. 5 is a schematic diagram of an inventive multilayered band separator with parasitic capacitor.

Appendix A is a graph showing the circuit response characteristic of the Quasi-highpass filter of FIG. 5; and Appendix B is a graph showing the frequency response of capacitor C11 of FIG. 5.

DETAILED DESCRIPTION OF THE INVENTION

The following numbers denote the same elements throughout the description and drawings.

FIG. 5 is a schematic diagram of an inventive multilayered band separator with a parasitic capacitor. For clarity of description, a dual band separator is given to be exemplary, not to be limited. In FIG. 5, the multilayered band separator with a parasitic capacitor includes a quasi-highpass filter QHF, a semi-lumped lowpass filter SLF, and a phase shifter L11. As shown in FIG. 5, the quasi-highpass filter QHF includes a third capacitor C33 connected to an input signal Ant, a fourth capacitor C44 with an end connected to the third capacitor C33 and another end connected to grounding, an inductive device L33 with an end connected to grounding and another end connected to the connection point P3 of the third and fourth capacitors C33, C44, and a second capacitor C22 with an end connected to a second output end DCS and another end connected to the connection point P3 of the third and fourth capacitors C33, C44 and the inductive device L33 to pass a high-frequency output signal. The phase shifter L11 is a transmission line connected to the input signal. The semi-lumped lowpass filter SLF includes a resistive device L22 with an end connected to a first output end GSM and another end P1 connected to another end of the phase shifter L11 to produce a low-frequency output signal, and a first capacitor C11 connected across the resistive device L22.

Figure 6:
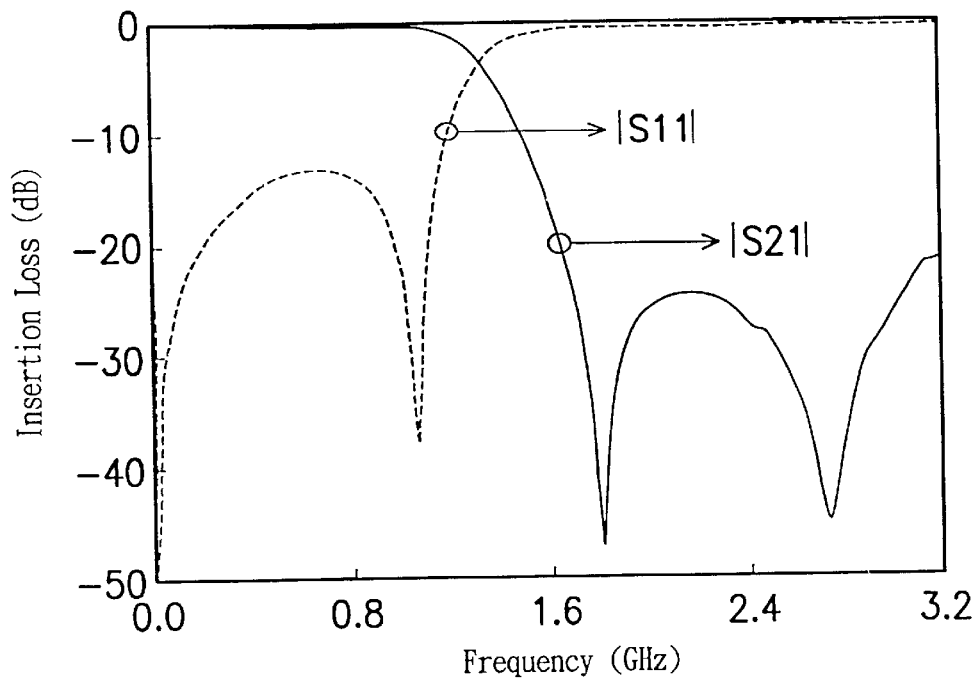
FIG. 6 is a diagram of the circuit response characteristics of FIG. 5.

The quasi-highpass filter QHF uses a grounding transmission line as an inductive device L33, and a parasitic capacitor c44 to shorten the required grounding transmission line length, thereby achieving the size reduction goal. Because the circuit response characteristics approximate those of a highpass filter, low insertion loss is obtained (see Appendix A). The phase shifter L11 converts the attenuation pole of the semi-lumped lowpass filter SLF into the open-circuit pole on the input end Ant (see Appendix A), and produces an attenuation pole on the low-frequency portion of the high-frequency response characteristics by connecting in series with the semi-lumped lowpass filter SLF. Therefore, high rejection effect and additional isolation bandwidth is carried out without any additional filter stage. For the semi-lumped lowpass filter SLF, insertion loss |S11| at the low-frequency operation and insertion loss |S21| at the high-frequency operation are changed with the linear frequency response of the capacitor C11 (see Appendix B) to get the best rejection as shown in FIG. 6.

Figure 7A:
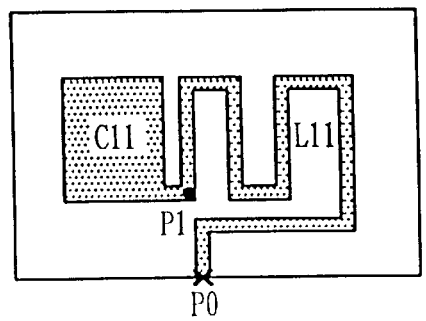
FIGS. 7(a)–7(h) are schematic diagrams of a circuit layout according to the invention.
Figure 7E:
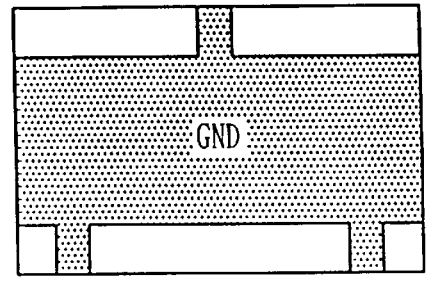
Figure 7B:
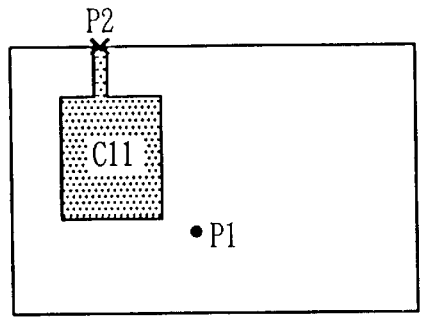
Figure 7F:
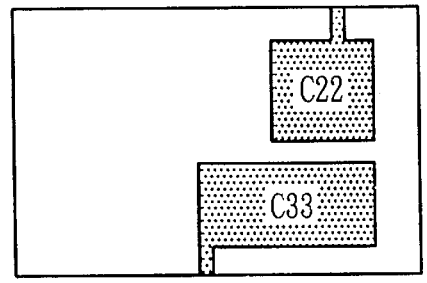
Figure 7C:
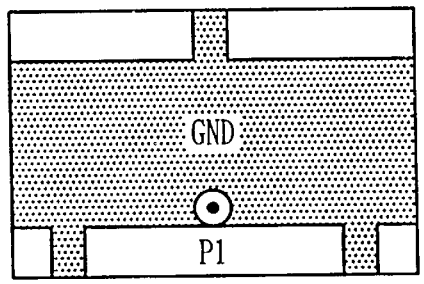
Figure 7G:
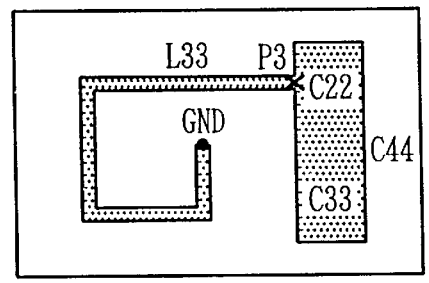
Figure 7D:
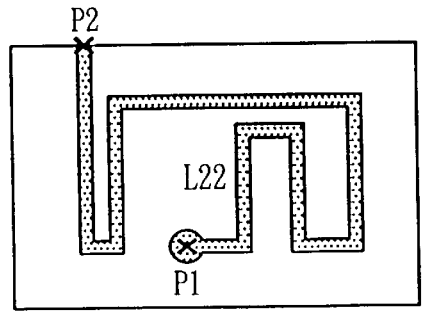
Figure 7H:
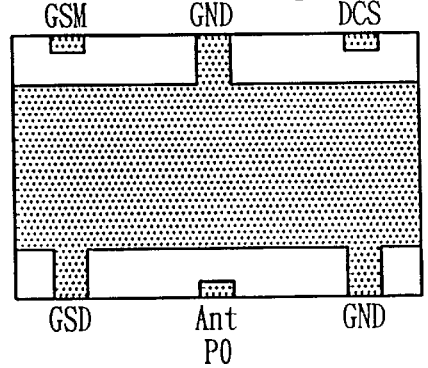

FIGS. 7(a)–(h) are a schematic diagram of the circuit layout of FIG. 5. As shown in FIG. 7(a), the layouts of C11 and L11 are carried out and reserve the via P1 at the spot notation to electrically connect every layer. As shown in FIG. 7(b), only the layout of C11 is carried out to produce the required discrete capacitor by interacting with the C11 layout of FIG. 7(a). As shown in FIG. 7(c), the layout of a protective grounding layer is carried out to isolate the next layout of L22 and produce a shunt effect with C11. As shown in FIG. 7(e), the layout of a protective grounding layer is also carried out to isolate the next layouts of C22, C33 and produce a shunt effect with C22, C33, wherein C22 has to keep an appropriate distance with C33. As shown in FIG. 7(g), the layouts of L33, C22 and C33 are carried out to form a shunt circuit, wherein C22 and C33 have no distance therebetween so as to produce the parasitic capacitor C44 by interacting with C22 and C33 of FIG. 7(f). As shown in FIG. 7(h), signal input and output terminals including an input signal terminal Ant, a high-frequency output terminal DCS, an low-frequency output terminal GSM and a grounding terminal GND are carried out to complete the entire circuit layout of FIG. 5.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A multilayered band separator with grounding parasitic capacitor, capable of separating a high-frequency signal and a low-frequency signal from an operating band with an input signal input by an input port, comprising:

a quasi-highpass filter, having three capacitive devices and a grounding inductive device in a cross-shaped implementation to be the high-frequency signal output passage, wherein a capacitive device is a grounding pararistic capacitor formed by the two other capacitive devices;

a phase shifter, connected in parallel to the quasi-highpass filter, to provide the low-frequency signal output passage; and a semi-lumped lowpass filter, connected in series to the phase shifter, to produce a higher outband rejection without an additional filter stage.

2. The multilayered band separator of claim 1, wherein the cross-shaped implementation is a third capacitor connected to the input port, a fourth capacitor with an end connected to the third capacitor and another end connected to grounding, an inductive device with an end connected to grounding and another end connected to the connection point of the third and fourth capacitors, and a second capacitor with an end connected to a second output end and another end connected to the connection point of the third and fourth capacitors and the inductive device to pass a high-frequency output signal.

3. The multilayered band separator of claim 1, wherein the phase shifter is a transmission line device connected to the input signal.

4. The multilayered band separator of claim 1, wherein the semi-lumped lowpass filter comprises an inductive device with an end connected to a first output end and another end connected to another end of the phase shifter to pass a low-frequency output signal, and a first capacitor connected across the inductive device.

5. The multilayered band separator of claim 1, wherein the operating band for the low-frequency signal ranges between 800–1000 MHz.

6. The multilayered band separator of claim 1, wherein the operating band for the high-frequency signal ranges between 1700–2000 MHz.

* * * * *